(12) United States Patent
Huang

(10) Patent No.: US 10,593,421 B2
(45) Date of Patent: Mar. 17, 2020

(54) METHOD AND APPARATUS FOR LOGICALLY REMOVING DEFECTIVE PAGES IN NON-VOLATILE MEMORY STORAGE DEVICE

(71) Applicant: Yiren Ronnie Huang, San Jose, CA (US)

(72) Inventor: Yiren Ronnie Huang, San Jose, CA (US)

(73) Assignee: CNEX Labs, Inc., San Jose, CA (US)

(\*) Notice: Subject to any disclaimer, the term of this patent is extended or adjusted under 35 U.S.C. 154(b) by 0 days.

(21) Appl. No.: 15/365,800

(22) Filed: Nov. 30, 2016

(65) Prior Publication Data

US 2017/0154689 A1    Jun. 1, 2017

Related U.S. Application Data

(60) Provisional application No. 62/261,748, filed on Dec. 1, 2015.

(51) Int. Cl.

| | | |
|---|---|---|
| *G11C 29/44* | (2006.01) | |
| *G11C 29/52* | (2006.01) | |
| *G11C 29/40* | (2006.01) | |
| *G11C 29/36* | (2006.01) | |
| *G11C 29/38* | (2006.01) | |
| G11C 29/54 | (2006.01) | |
| G11C 29/04 | (2006.01) | |

(52) U.S. Cl.
CPC .............. *G11C 29/44* (2013.01); *G11C 29/36* (2013.01); *G11C 29/38* (2013.01); *G11C 29/40* (2013.01); *G11C 29/52* (2013.01); *G11C 2029/0409* (2013.01)

(58) Field of Classification Search
CPC ......... G11C 29/44; G11C 29/36; G11C 29/38; G11C 29/40; G11C 29/52; G11C 2029/0409
See application file for complete search history.

(56) References Cited

U.S. PATENT DOCUMENTS

| | | | |
|---|---|---|---|
| 7,363,556 B2 | 4/2008 | Doi | |
| 7,472,331 B2 | 12/2008 | Kim | |
| 8,245,101 B2 | 8/2012 | Olbrich | |
| 8,959,280 B2 | 2/2015 | Yu | |
| 9,063,844 B2 | 6/2015 | Higgins | |
| 9,529,709 B2 * | 12/2016 | Wang | .................. G06F 12/0246 |

(Continued)

*Primary Examiner* — April Y Blair
*Assistant Examiner* — Dipakkumar B Gandhi
(74) *Attorney, Agent, or Firm* — James M Wu; JW Law Group

(57) ABSTRACT

One embodiment of the present invention capable of decommissioning a defective non-volatile memory ("NVM") page in a block is disclosed. A process able to logically decommission a defective page is able to detect defective or bad pages while executing a write operation writing information to one or more NVM page in a NVM block. For example, after examining operation status after completion of the write operation, the NVM page is identified as a defective page if the operation status fails to meet a set of predefined conditions under a normal write operation. Upon marking a location of a page status table to indicate the NVM page as defective page, the page status table containing the page defective information associated with the NVM page is stored at a predefined page in the NVM block.

28 Claims, 9 Drawing Sheets

(56) References Cited

U.S. PATENT DOCUMENTS

| | | | | |
|---|---|---|---|---|
| 2003/0115518 A1* | 6/2003 | Kleveland | | G11C 29/4401 |
| | | | | 714/718 |
| 2005/0138314 A1* | 6/2005 | Liang | | G06F 12/1425 |
| | | | | 711/163 |
| 2009/0097494 A1* | 4/2009 | Yuan | | H04L 49/90 |
| | | | | 370/412 |
| 2009/0327822 A1* | 12/2009 | Kameda | | G06F 11/1068 |
| | | | | 714/718 |
| 2009/0327837 A1* | 12/2009 | Royer | | G06F 12/0246 |
| | | | | 714/763 |
| 2010/0011156 A1* | 1/2010 | Yim | | G06F 12/0246 |
| | | | | 711/103 |
| 2011/0055464 A1 | 3/2011 | Moon | | |
| 2011/0087950 A1* | 4/2011 | Yu | | G06F 11/1072 |
| | | | | 714/773 |
| 2011/0320758 A1* | 12/2011 | Craddock | | G06F 12/0292 |
| | | | | 711/206 |
| 2012/0191900 A1* | 7/2012 | Kunimatsu | | G06F 12/0223 |
| | | | | 711/103 |
| 2013/0042053 A1* | 2/2013 | Huang | | G06F 11/106 |
| | | | | 711/103 |
| 2014/0208004 A1 | 7/2014 | Cohen et al. | | |
| 2015/0081985 A1* | 3/2015 | Archer | | G06F 3/0613 |
| | | | | 711/147 |
| 2015/0149818 A1* | 5/2015 | Kalavade | | G06F 11/073 |
| | | | | 714/6.13 |
| 2015/0242146 A1 | 8/2015 | Shinozaki et al. | | |
| 2015/0261446 A1* | 9/2015 | Lee | | G06F 13/385 |
| | | | | 711/103 |
| 2016/0320986 A1* | 11/2016 | Bonwick | | G06F 3/0619 |
| 2016/0328286 A1* | 11/2016 | Hoekstra | | G06F 11/1068 |

\* cited by examiner

METHOD AND APPARATUS FOR LOGICALLY REMOVING DEFECTIVE PAGES IN NON-VOLATILE MEMORY STORAGE DEVICE

PRIORITY

This application claims the benefit of priority based upon U.S. Provisional Patent Application having an application Ser. No. 62/261,748, filed on Dec. 1, 2015, and having a title of "Method and Apparatus for Logically Removing Defective Pages in Non-Volatile Memory Storage Device," which is hereby incorporated herein by reference in its entirety.

FIELD

The exemplary embodiment(s) of the present invention relates to the field of semiconductor and integrated circuits. More specifically, the exemplary embodiment(s) of the present invention relates to non-volatile memory ("NVM") storage devices.

BACKGROUND

With increasing popularity of electronic devices, such as computers, smart phones, mobile devices, automobiles, drones, real-time images, wireless devices, server farms, mainframe computers, and the like, the demand for reliable data storage with high-speed is constantly growing. To handle voluminous data between various electronic devices, high-volume non-volatile memory ("NVM") storage devices are in high demand. A conventional NVM storage device, for example, is flash based storage device typically known as solid-state drive ("SSD").

The flash memory based SSD, for example, is an electronic NV storage device using arrays of flash memory cells. The flash memory can be fabricated with several different types of integrated circuit ("IC") technologies such as NOR or NAND logic gates with, for example, floating-gate transistors. Depending on the applications, a typical flash memory based NVM is organized in blocks wherein each block is further divided into pages. The access unit for a typical flash based NVM storage is a page while conventional erasing unit is a block at a given time.

A problem, however, associated with a conventional NVM storage device is that when one or more NVM pages become defective, a large portion or entire NVM storage device may be discarded or replaced.

SUMMARY

A method and apparatus capable of decommissioning a defective non-volatile memory ("NVM") page in a block is disclosed. A process able to logically decommission a defective page is capable of detecting defective or bad pages while executing a write operation writing information to one or more NVM page in a NVM block. For example, after examining operation status after completion of the write operation, the NVM page is identified as a defective page if the operation status fails to meet a set of predefined conditions under a normal write operation. Upon marking a location of a page status table to indicate the NVM page as defective page, the page status table containing the page defective information associated with the NVM page is stored at a predefined page in the NVM block.

In an alternative exemplary embodiment, the process is capable of detecting defective or bad pages while executing a read operation obtaining data from one or more NVM page in a NVM block. For example, upon receiving a read request from a host to a memory controller, a defective NVM page can be detected during a read operation. After marking the defective page at a page status table, the table which contains defect information associated with the NVM page is stored at a predefined page at the NVM block. In one aspect, the content of page status table is preserved between block erase operations. In addition, the process is capable of automatically adjusting accessing NVM page when the page status table indicates that the original targeted NVM page is defective.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
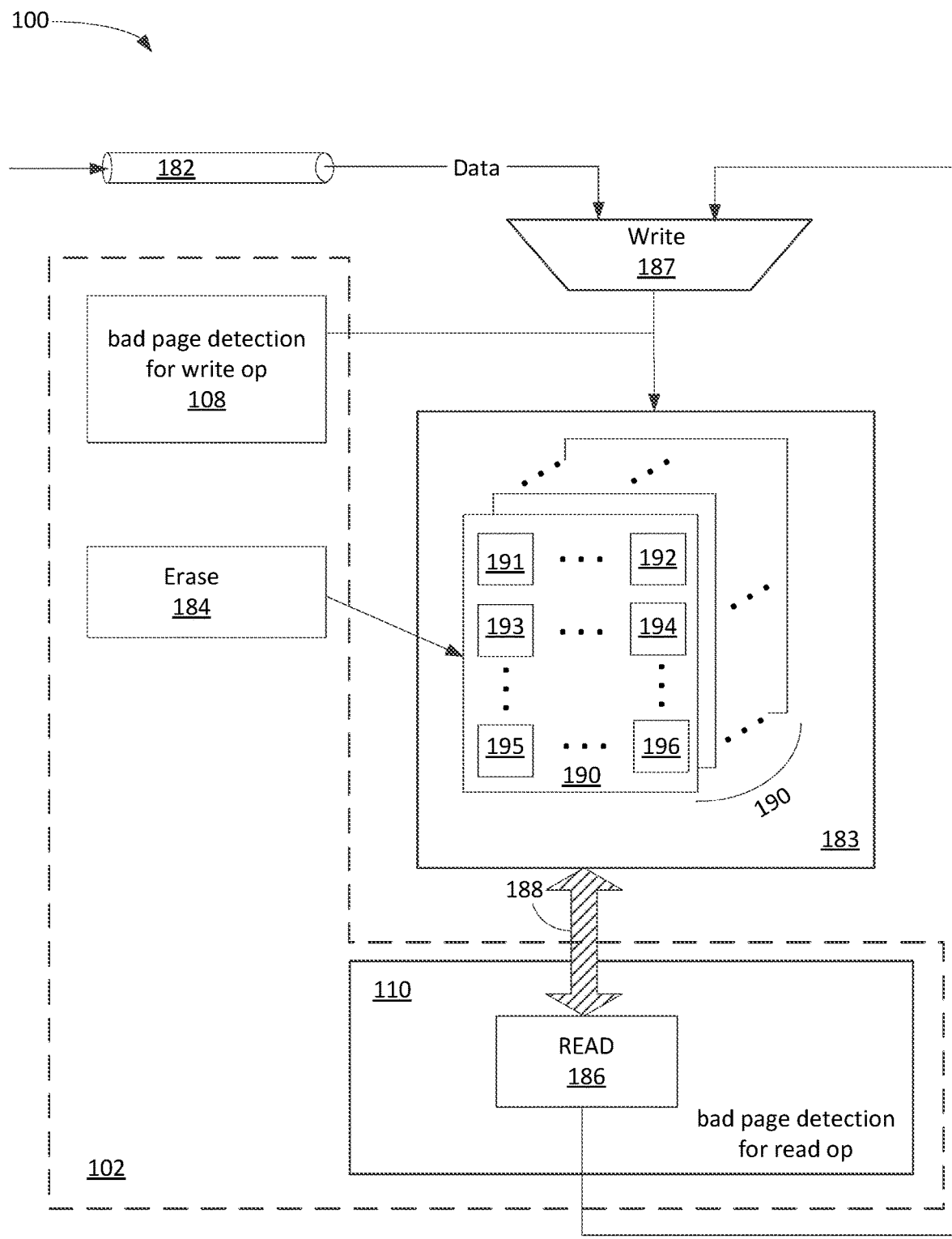
FIG. 1 is a block diagram illustrating a memory system able to access NVM while detecting and managing defective pages in accordance with one embodiment of the present invention.

Embodiments of the present invention are described herein with context of a method and/or apparatus for decommissioning a defective non-volatile memory ("NVM") page in NVM block.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. In addition, those of ordinary skills in the art will recognize that devices of a less general purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

One embodiment of the present invention discloses a method or apparatus capable of decommissioning a defective non-volatile memory ("NVM") page in a block. A process able to logically decommission a defective page is able to detect defective or bad pages while executing a write operation writing information to one or more NVM page in a NVM block. For example, after examining operation status after completion of the write operation, the NVM page is identified as a defective page if the operation status fails to meet a set of predefined conditions under a normal write operation. Upon marking a location of a page status table to indicate the NVM page as defective page, the page status table containing the page defective information associated with the NVM page is stored at a predefined page in the NVM block.

In an alternative exemplary embodiment, the process can detect defective or bad pages while executing a read operation obtaining data from one or more NVM page in a NVM block. For example, upon receiving a read request from a host to a memory controller, a defective NVM page can be detected during a read operation. After marking the defective page at a page status table, the table which contains defect information associated with the NVM page is stored at a predefined page at the NVM block. In one aspect, the content of page status table is preserved between block erase operations. In addition, the process is capable of automatically adjusting accessing NVM page when the page status table indicates that the original targeted NVM page is defective.

FIG. 1 is a block diagram 100 illustrating a memory system able to access NVM while detecting and managing defective pages in accordance with one embodiment of the present invention. Diagram 100 includes input data 182, storage device 183, output port 188, and storage controller 102. Storage controller 102 further includes read module 186 and/or write module 187. Diagram 100 also includes an erase module 184 which can be part of storage controller 102 for erasing or recycling used NVM blocks. It should be noted that the underlying concept of the exemplary embodiment(s) of the present invention would not change if one or more blocks (or devices) were added to or removed from diagram 100.

Storage device 183, in one example, includes a flash memory based NVM such as SSD. The flash memory cells are organized in multiple arrays for storing information persistently. The flash memory, which generally has a read latency less than 100 microseconds ("µs"), can be organized in logic units ("LUN"), planes, blocks, and pages. A minimum access unit such as read or write operations, for example, can be set to an NVM page which can be four (4) kilobyte ("Kbyte"), eight (8) Kbyte, or sixteen (16) Kbyte memory capacity depending on the flash memory technologies. A minimum erasing or recycling used NVM pages is generally set to be a NVM block at a time. An NVM block, in one example, can contain 64 to 1024 NVM pages.

In one aspect, other types of NVM, such as phase change memory ("PCM"), magnetic RAM ("MRAM"), STT-MRAM, or ReRAM, can also be used in storage device 183. Also, a four (4) Kbyte page or flash memory page ("FMP") is used for the forgoing discussion. It should be noted that a storage system can contain multiple storage devices such as storage devices 183. To simplify the forgoing discussion, the flash memory or flash memory based SSD is herein used as an exemplary NV storage device.

Storage device 183, in one embodiment, includes multiple NVMs or flash memory blocks ("FMBs") 190. Each of FMBs 190 further includes a set of pages or FMPs 191-196 wherein each page such as page 191 has a block size of 4096 bytes or 4 Kbyte. In one example, FMBs 190 can contain from 128 to 512 pages or sectors. A page or block is generally a minimal writable unit or readable unit. Blocks such as FMBs 190 are able to persistently retain information or data for a long period of time without power supply.

Storage controller or controller 102, in one embodiment, includes write-operation bad-page detector ("WBD") 108, read-operation bad-page detector ("RBD") 110, and erase module 184. In one aspect, controller 102 includes a flash translation layer ("FTL") not shown in FIG. 1 for facilitating managing and controlling WBD 108, RBD 110, and erase module 184. The FTL table(s), in one example, is stored in one or more of the NVM pages.

WBD 108, in one embodiment, is configured to detect bad page or defective pages during a write operation which can be performed by write module 187. Upon completing a write operation, WBD 108 retrieves write status such as error rate occurred during the write operation and a set of predefined threshold values. If, for example, the error rate is higher than the threshold value, the NVM page should be considered bad page or defective page. In one aspect, a page status table which can be a bit map is used to remember which NVM page is a defective page.

RBD 110, in one embodiment, is configured to detect bad page or defective pages during a read operation which can be performed by read module 186. Upon completing a read operation, RBD 110 retrieves read status such as error rate occurred during the read operation and a set of predefined read threshold values. If, for example, the error rate is higher than the threshold value, the NVM page should be considered bad page or defective page. In one aspect, a page status table which can be a bit map is used to remember which NVM page is a defective page. In one embedment, RDB 110 is also able to identify whether the defective page is due to number of read times since the frequency of reading from the same page can deteriorate overall integrity of the content stored in the page.

Erase module 184, in one embodiment, is able to preserve the page status table between erase operations performed to each block. In one aspect, the page status table or bit map indicating defective page(s) within an erase-marked NVM block is first stored in a register or another NVM block before the erase-marked NVM block is erased. After the erase operation, the page status table is restored back in the previously erase-marked NVM block whereby the defective page(s) is continuously decommissioned.

FTL, also known as FTL table, is an address mapping table. FTL includes multiple entries which are used for NVM memory accessing. Each entry of the FTL table, for example, stores a PPA addressing a physical page in the NVM. A function of FTL is to map logical block addresses ("LBAs") to physical page addresses ("PPAs") whereby the PPA(s) can be accessed by a write or read command. In one aspect, FTL is capable of automatically adjusting access NVM page when the page status table indicates that the original targeted NVM page is defective. For example, FTL includes a record indicating the replacement pages for defective pages for both read or write operations.

In operation, upon receipt of data input or data packets 182, write module or circuit 187 writes the data from data packets 182 to a page or pages within a block pointed by LBA or PPA facilitated by FTL. Also, the data stored in storage device 183 can be refreshed or read by read module 186 via output port 188. In one embodiment, WBD 108 is used to detect defective page(s) during the write operation. Similarly, RBD 110 is used to detect or identify defective page(s) during a read operation.

An advantage of employing a mechanism of decommissioning an NVM page within NVM block is that it can enhance overall NVM efficiency as well as NVM reliability.

Figure 2:
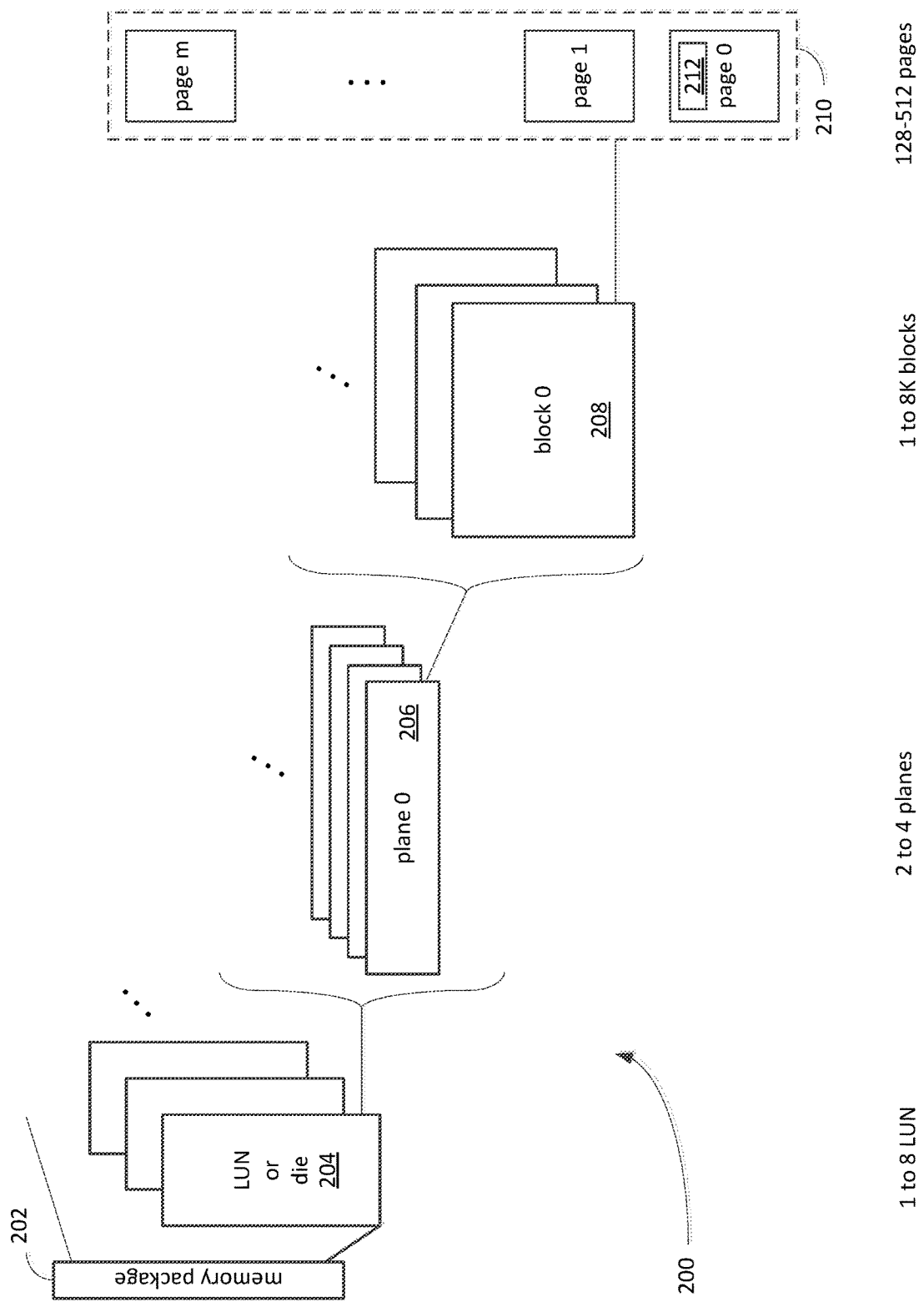
FIG. 2 is a block diagram illustrating an exemplary layout for NVM device capable of logically removing or decommissioning one or more defective NVM page(s) from a block(s) in accordance with one embodiment of the present invention.

FIG. 2 is a block diagram 200 illustrating an exemplary layout for NVM device capable of logically removing or decommissioning one or more defective NVM page(s) from a block(s) in accordance with one embodiment of the present invention. Diagram 200 includes a memory package 202 which can be a memory chip containing one or more NVM dies or logic units ("LUNs") 204. Memory package 202, in one aspect, is a flash based NVM storage that contains, for example, a hierarchy of Package-Silicon Die/LUN-Plane-Block-Flash Memory Page-Wordline configuration(s). It should be noted that the underlying concept of the exemplary embodiment(s) of the present invention would not change if one or more blocks (or devices) were added to or removed from diagram 200.

The NVM device such as a flash memory package 202, in one example, contains one (1) to eight (8) flash memory dies or LUNs. Each LUN or die 204 can be divided into two (2) to four (4) NVM or flash memory planes 206. For example, die 204 may have a dual planes or quad planes. Each NVM or flash memory plane 206 can further include multiple memory blocks or blocks. In one example, plane 206 can have a range of 1000 to 8000 blocks. Each block such as block 208 includes a range of 64 to 512 pages. For instance, block 210 includes 64 or 512 NVM pages depending on NVM technologies.

A flash memory page such as page 1, for example, has a memory capacity from 8 KBytes to 64 KBytes plus extra redundant area for management purposes such as ECC parity bits and/or FTL tables. Each NVM block, for instance, contains from 256 to 512 NVM pages. In an operation, a flash memory block is the minimum unit of erase and a flash memory page is the minimum unit of program (or write) and read.

To avoid discarding an entire block due to a few bad or defective pages, a mechanism of logically decommissioning defective page(s) is used. A function of decommissioning process is to maintain the operation of the NVM block while logically removing bad or defective pages. To identify a defective page within NVM block, a page status table is used to keep track of active pages versus defective pages within each NVM block. It should be noted that 4 Megabytes ("MB") to 128 MB of storage space can be saved if the page decommissioning is used instead of discarding the entire block.

It should be noted that based on flash memory characteristics, a relatively small number of flash memory pages may be defective or become bad or unusable during a high memory page PE (program erase) cycles. With the implementation of page decommissioning process, a bad or defective NVM page, for instance, can be discovered during program or read operation. For example, a defective or bad page is discovered if that page has higher read errors during normal read work load. Also, a defective or bad page can be determined when error rate is higher than normal during an erase operation.

Upon discovery of a defective page such as page 1 of block 210, a page status table 212 is used to store the defective information of page 1. In one aspect, page status table 212 resides in a predefined memory page such as page 0 of each block. For example, block 210 contains page status table 212 which indicates status information whether it is defective or active associated to all pages in block 210.

An advantage of using page decommissioning is that it logically removes the defective NVM page(s) from an NVM block while the remaining NVM pages within the NVM block are operating normally.

Figure 3:
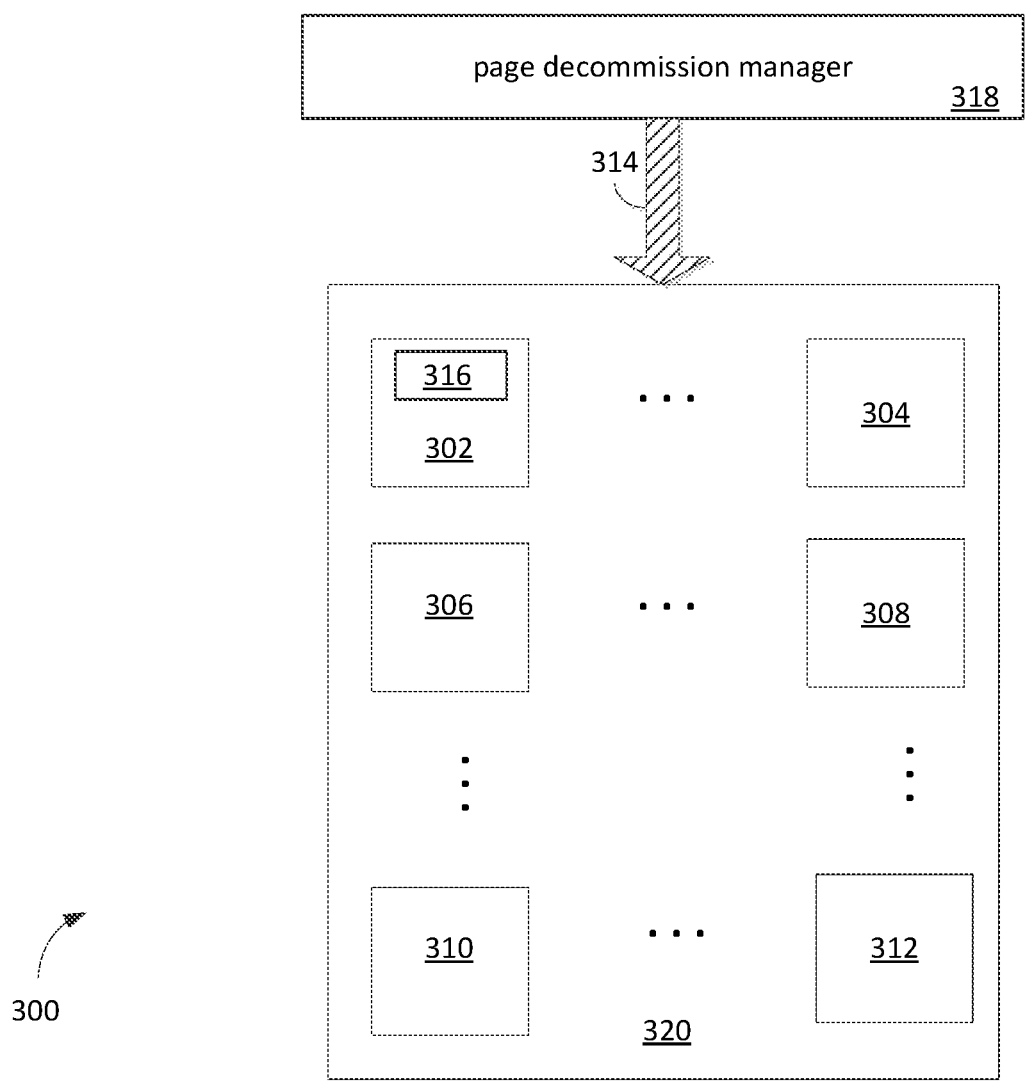
FIG. 3 is a logic diagram illustrating a storage device capable of logically decommissioning a defective NVM page in an NVM block in accordance with one embodiment of the present invention.

FIG. 3 is a block diagram 300 illustrating a storage device capable of logically decommissioning a defective NVM page in an NVM block in accordance with one embodiment of the present invention. Diagram 300 illustrates a flash memory block 320 and page decommission manager 318. Block 320, in one example, contains 512 NVM pages 302-312 wherein the first page such as page 302 is a designated page for storing page status table 316. Page status table 316, in one aspect, contains active and defective information associated to all pages 302-312 of block 302. It should be noted that other page or pages can also be used as a designated page to store page status table 316.

In one embodiment, manager 318 can mark a page as a bad page by a bit map or page status table 316 which is associated with flash memory block 320. For example, manager 318 stores a page status table 316 which contains bad page information in a bit map in the first flash memory page such as page 302. Manger 318 is coupled to block 320 via internal bus 324 to commission and/or decommission certain pages within block 320 due to defective pages. The defective page, for example, is defected or identified when the flash memory block such as page 310 of block 320 is programmed or written. Manager 318 is also configured to facilitate remembering to restoring content of page status table 316 between block erase operations performed to block 320. For example, the content of page status table 316 is saved in registers in page decommission manager 318 while performing an erase operation to page 320. The content of page status table 316 is subsequently restored from the registers of page decommissioning manager 318 to page 302 after erasing operation. In one embodiment, if page 302 is defective, page decommission manager 318 can elect another page such as page 312 as the designated page to save the page status table. For example, after recycle operation, manager 318 writes the previously saved content for page status table 316 back into first flash memory page such as page 302.

Figure 4:
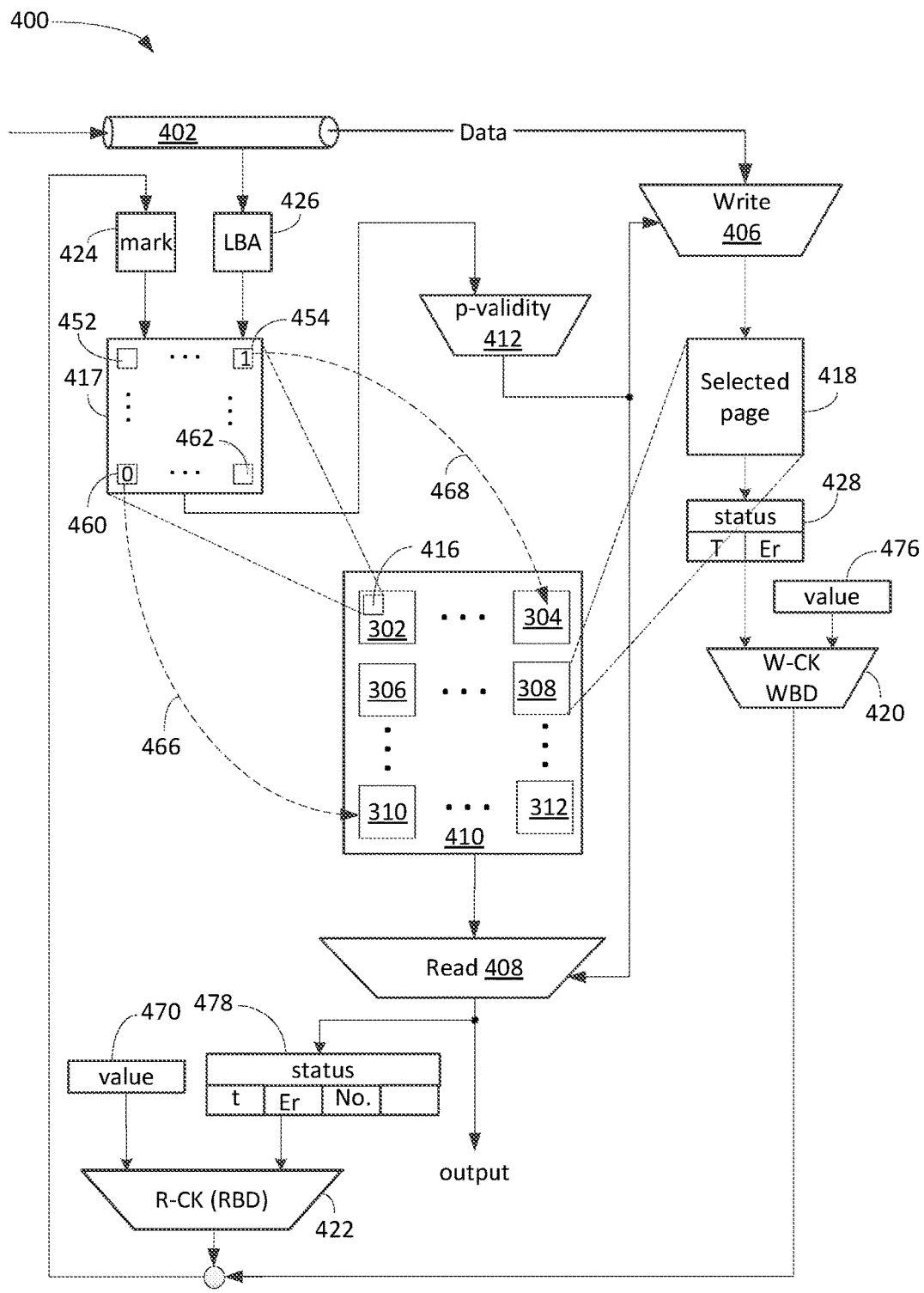
FIG. 4 is a diagram illustrating a process of logically decommissioning or removing a NVM page from a block in accordance with one embodiment of the present invention.

FIG. 4 is a diagram 400 illustrating a process of logically decommissioning or removing a NVM page from a block in accordance with one embodiment of the present invention. Diagram 400 includes input data 402, write module 406, read module 408, and NVM block 410. In an alternative embodiment, NVM block 410 can be substituted with multiple NVM blocks. To simplify the forgoing illustration, one NVM block 410 which contains multiple pages 302-312 is used. It should be noted that the underlying concept of the exemplary embodiment(s) of the present invention would not change if one or more blocks (or devices) were added to or removed from diagram 400.

Block 410, in one example, is a flash based NVM block containing multiple NVM pages 302-312 in which the first page such as NVM page 302 is designated for storing page status table 416. In one aspect, page status table 416 can be a bit map. Alternatively, page status table 416 includes multiple entries wherein each entry includes a validity portion and an address portion. The validity portion indicates whether the page is defective or active while the address portion indicates a page address. For example, NVM pages in block 410 can be organized in a sequential order wherein page 302 is the first page in the sequence while page 312 is the last page in the sequence.

Bit map 417, in one embodiment, is a blow-up diagram for page status 416 showing bit positions 452-462. The bit positions in bit map 417 are configured to correspond to page positions 302-312 in block 410. For example, bit 454 contains a logic value of one (1) which refers to a defective page is used to indicate the corresponding page 304 in block 410 as a defective page as indicated by arrow 468. Similarly, bit 460 in bit map 317 has a logic value of zero (0) which refers to an active page is used to indicate the corresponding page 310 as an active page as indicated by arrow 466.

During a write operation, write module 406 obtains input data 402 from incoming data stream while allowing LBA 426 associated with data 402 to travel to bit map 417. After verifying validity of physical page in accordance with LBA 426, page validity module 412 issues a validity signal to write module 406. If the page is invalid or defective, a new page is subsequently selected such as next page in the sequence. If the page is active or valid, write module 406 begins to write data 402 to a selected page 418 which could correspond to page 308 of block 410. After written or programmed page 418, WBD 420 checks and compares writing status 428 with retrieved value 476 to determine whether page 418 is defective or not. While retrieved value 476 can be a set of predefined maximum error rate(s) for a normal write operation, status 428 which includes various parameters such as error rate(s) and time consumed for the last write operation contain the most recent write status. The result of comparison between status 428 and value 476 is subsequently forwarded to mark module 424. Mark module 424 subsequently marks the logic value(s) based on the result of comparison. For example, if WBD 420 detects a defective page, mark module 424 marks or switches the logic value(s) of a bit corresponding to the defective page such as page 308.

For a read operation, read module 408 obtains LBA 426 as read address and allows LBA 426 to reach bit map 417. After verifying validity of physical page in accordance with LBA 426, page validity module 412 issues a validity signal to read module 408. If the page is invalid or defective, a new page is subsequently selected such as next page in the sequence. If the page is active or valid, read module 408 begins to read data from a selected page such as page 310 of block 410. After read operation, RBD 422 checks and compares reading status 478 with retrieved value 470 to determine whether read page such as page 310 is defective or not. While retrieved value 470 can be a predefined maximum error rate for a normal read operation, status 478 includes various parameters such as error rate, time consumed for the last read operation, and total number read times performed to the particular page such as page 310. For example, an error can occur if the page such as page 310 has been read too many times. The result of comparison between status 478 and value 470 is subsequently forwarded to mark module 424. Mark module 424 marks the logic value(s) based on the result of comparison. For example, if RBD 422 detects a defective page, mark module 424 marks or switches the logic value(s) of a bit corresponding to the defective page such as page 310.

An advantage of using a process of WBD or RBD 420-422 is that an NVM block such as block 410 can operate normally even though there is a portion of pages in the NVM block are defective.

Figure 5:
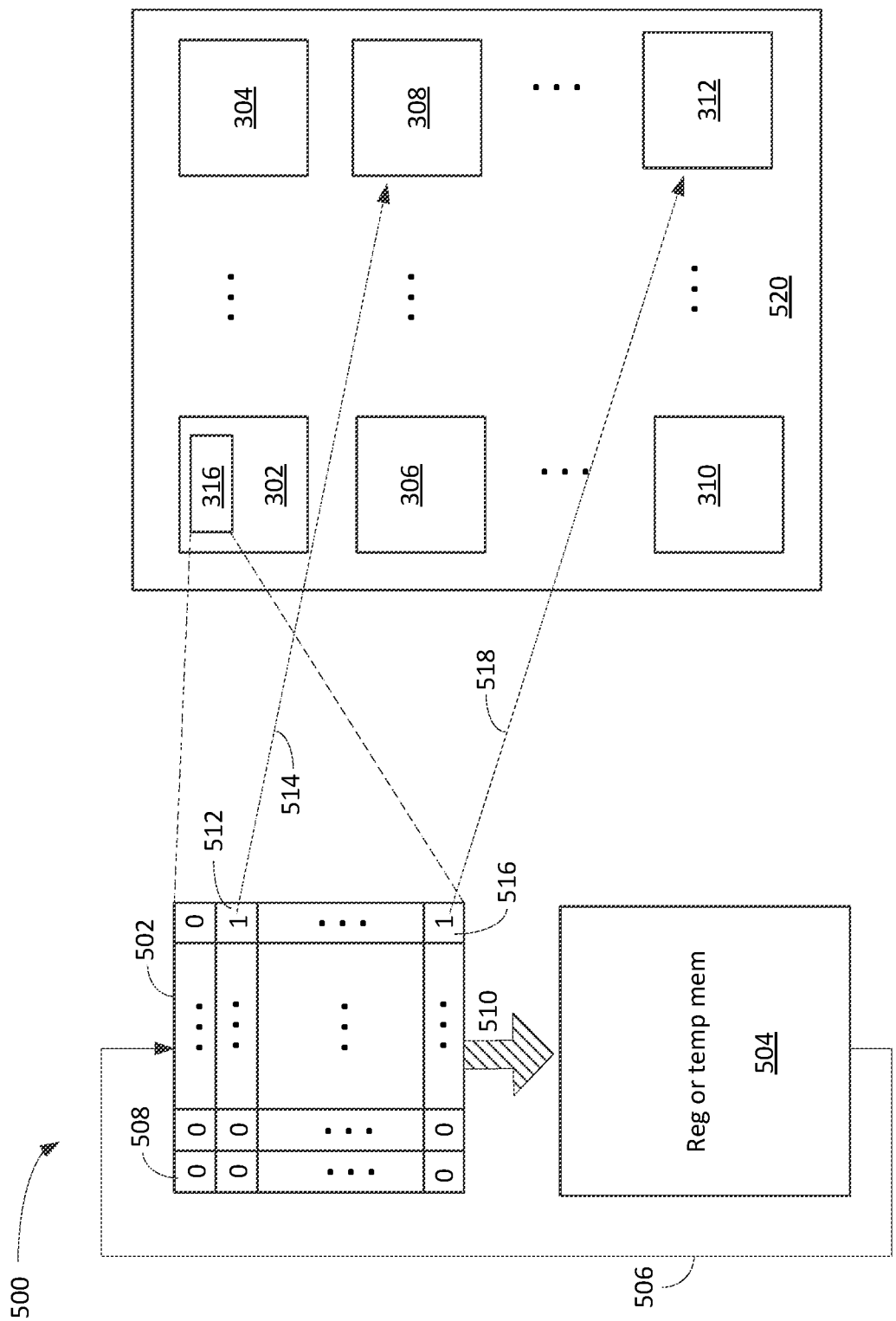
FIG. 5 is a diagram illustrating a bit map used for a page status table configured to indicate defective pages in accordance with one embodiment of the present invention.

FIG. 5 is a block diagram 500 illustrating a bit map used for a page status table configured to indicate defective pages in accordance with one embodiment of the present invention. Diagram 500, in one embodiment, includes an NVM block 520, bit map 502, and temporary memory 504. While NVM block 520 includes multiple NVM pages 302-312, bit map 502 is stored at the first page in the sequence such as page 302. The total number of bits in bit map 502 is the same or similar to the total number of pages 302-312 in block 520. Each bit of bit map 502, in one example, is configured to correspond to a page of block 520.

NVM block 520, in one example, includes 256 pages organized in 16 rows by 16 columns. To track the status for each page within NVM block 520, a bit map 502 is also organized in 16 rows by 16 columns within each bit indicates validity of an associated page. In one aspect, the logic state of bit zero (0) indicates an active status and logic state of bit one (1) indicates a defective status. For instance, bit 508 located at row 1 and column 1 of bit map 502 is used to indicate the status for page 302 which is located at row 1 and column 1 in block 520. Since bit 508 contains a logic value of zero (0), page 302 is active.

Bit 512 located at row 2 and column 16 of bit map 502 is used to indicate the status of page 308 which is located at row 2 and column 16 of block 520. Since bit 512 contains logic value of one (1), page 308 is defective as indicated by arrow 514 which should be logically decommissioned. Alternatively, bit 516 located at row 16 and column 16 of bit map 502 is used to indicate the status of page 312 which is located at row 16 and column 16 of block 520. Since bit 516 contains logic value of one (1), page 312 is defective as indicated by arrow 518 which should be logically decommissioned.

In one embodiment, temporary memory 504 can be a set of registers, dynamic random access memory ("DRAM"), or NVM storage space. For example, temporary memory 504 can be placed in a block other than block 520. A function of temporary memory 504 is to save the content of bit map 502 or page defective information before performing an erase function to block 520 for memory erasing, recycling, or reclamation. Once the erase function is completed, the saved content of bit map 502 in temporary memory 504 is restored back to bit map 502 as indicated by arrow 506.

In an alternative embodiment, bit map 502 can be organized in a sequential order when NVM pages in block 520 are also arranged in a sequential order. In one example, the same bit number position within 256 bits can be used to reference or locate the same page number position in the block with 256 pages such as block 520.

An advantage of using a bit map having the bit number same as the page number is that the address bits are not necessary in order to locate targeted page(s) within the block because the relative bit position is use to reference the same relative page position.

Figure 6:
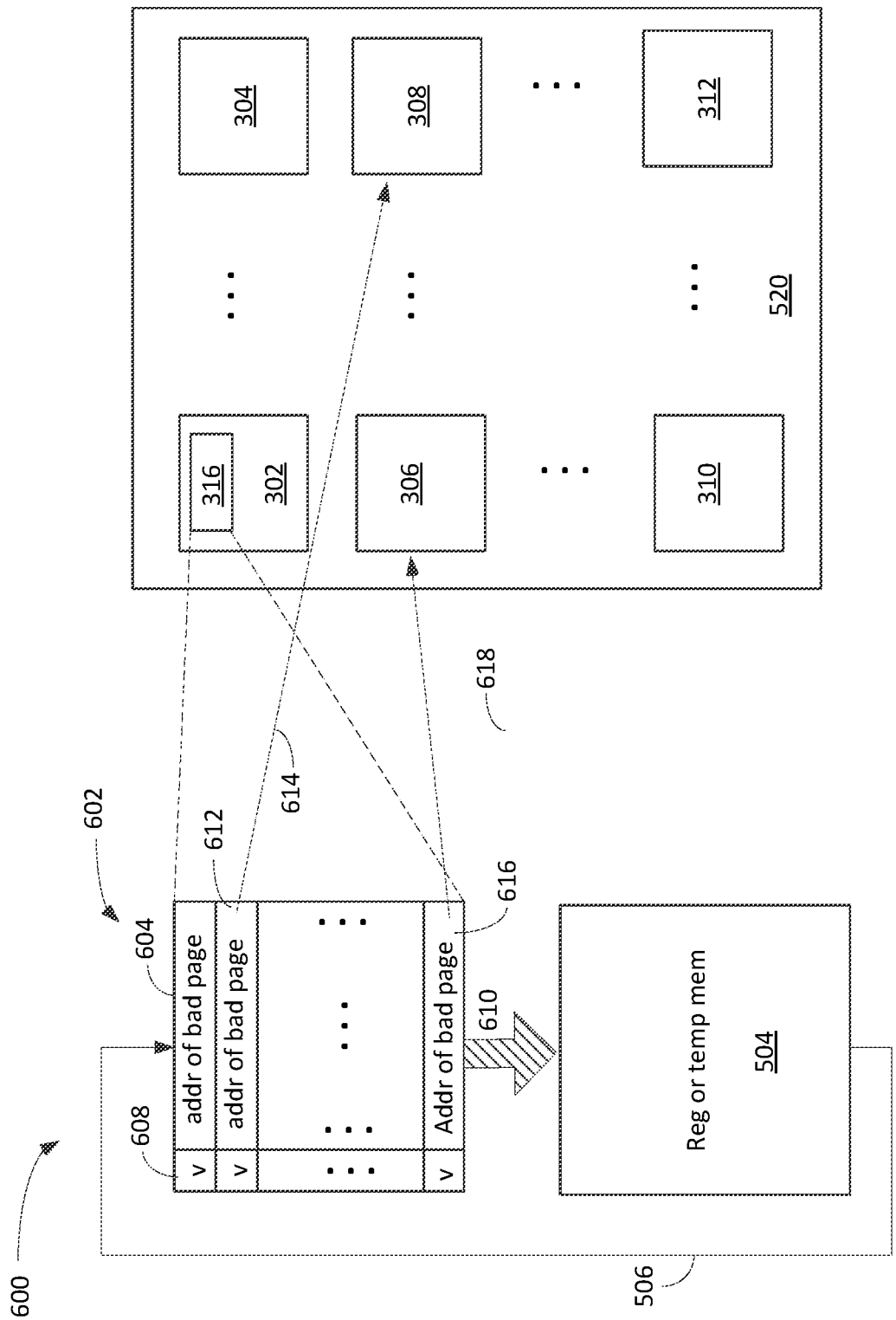
FIG. 6 is a diagram illustrating a page status table containing validity bit and address bits to indicate defective pages in a block in accordance with one embodiment of the present invention.

FIG. 6 is a diagram 600 illustrating a page status table containing validity bits 608 and address bits 604 to indicate defective pages in accordance with one embodiment of the present invention. Diagram 600 is similar to diagram 500 except that diagram 600 contains a page status table 602 using addresses 604 to point bad or defective pages. Page status table 602, in one embodiment, includes multiple entries wherein each entry includes a validity bit 608 and address bits 604. Address bits 604, in one example, includes sufficient number of bits to address entire pages within block 520. For example, if block 520 includes 256 NVM pages 302-312, eight (8) bits may be required to address 256 pages.

For example, page status table 602 contains ten (10) entries with nine (9) bits per entry. A total of 90 bits is allocated for page status table 602. In this example, a maximum number of 10 NVM pages within a block can be decommissioned. An advantage of using page status table 602 instead of bit map 502 shown in FIG. 5 is that page status table 602 uses less bits than bit map 502 if the decommissioned pages are kept 10 or less.

Figure 7:
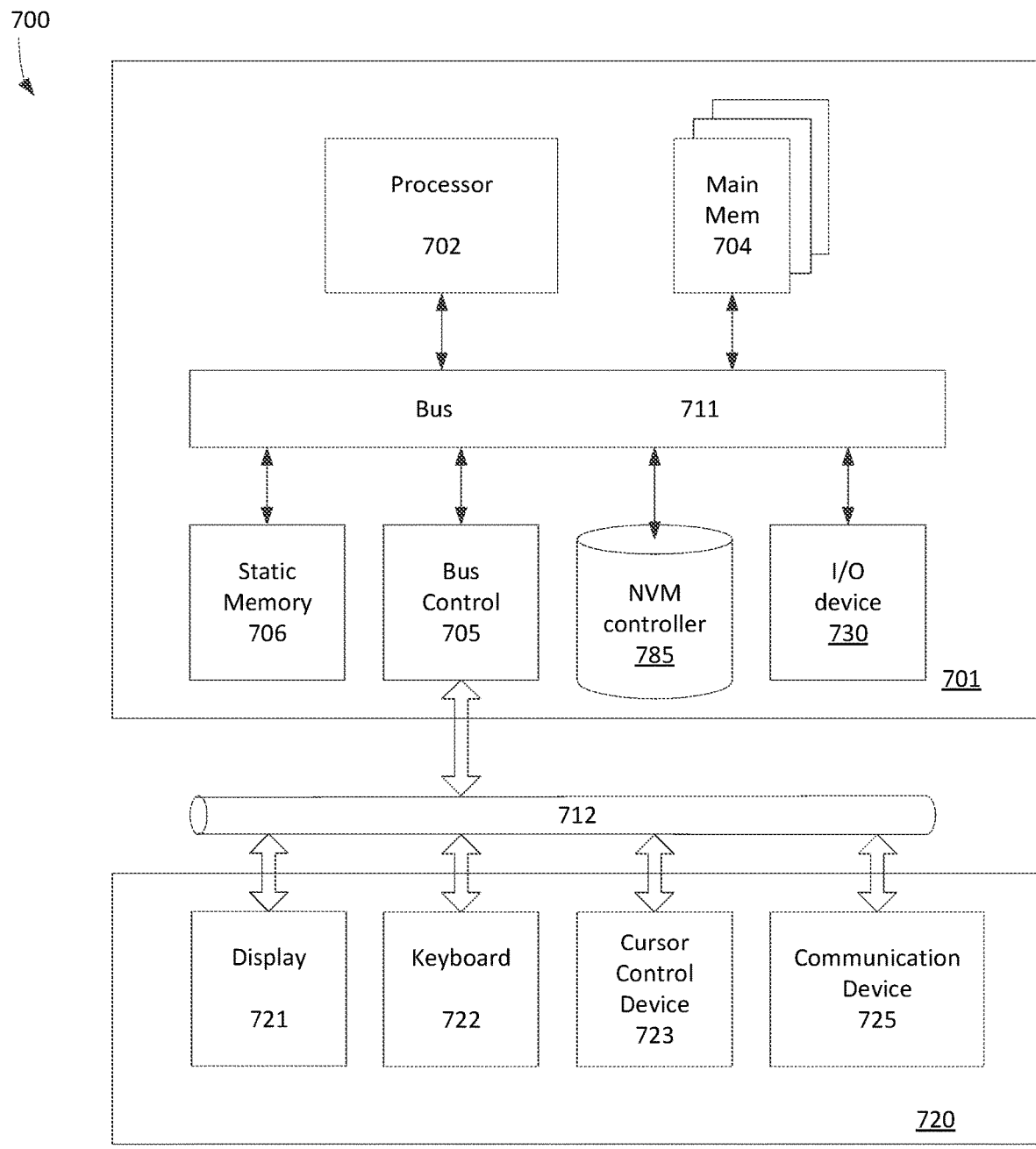
FIG. 7 is a block diagram illustrating a host or memory controller capable of decommissioning defective pages in accordance with one embodiment of the present invention.

FIG. 7 is a block diagram 700 illustrating a host or memory controller capable of decommissioning defective pages in accordance with one embodiment of the present invention. Computer system or a signal separation system 700 can include a processing unit 701, an interface bus 712, and an input/output ("IO") unit 720. Processing unit 701 includes a processor 702, a main memory 704, a system bus 711, a static memory device 706, a bus control unit 705, an I/O element 730, and a NVM controller 785. It should be noted that the underlying concept of the exemplary embodiment(s) of the present invention would not change if one or more blocks (circuit or elements) were added to or removed from diagram 700.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD 106, which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and communication device 725. Display device 721 may be a liquid crystal device, cathode ray tube ("CRT"), touch-screen display, or other suitable display device. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other type of cursor for communicating information between system 700 and user(s).

Communication device 725 is coupled to bus 711 for accessing information from remote computers or servers, such as server 104 or other computers, through wide-area network 102. Communication device 725 may include a modem or a network interface device, or other similar devices that facilitate communication between computer 700 and storage network.

NVM controller 785, in one aspect, is configured to communicate and manage internal as well as external NVM storage devices. NVM controller 785 can manage different types NVM memory cells such as flash memory cells and phase change memory cells. For external NVM storage devices, NVM controller 785 further includes I/O interfaces capable of interfacing with a set of peripheral buses, such as a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, Infiniband, or the like.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 8:
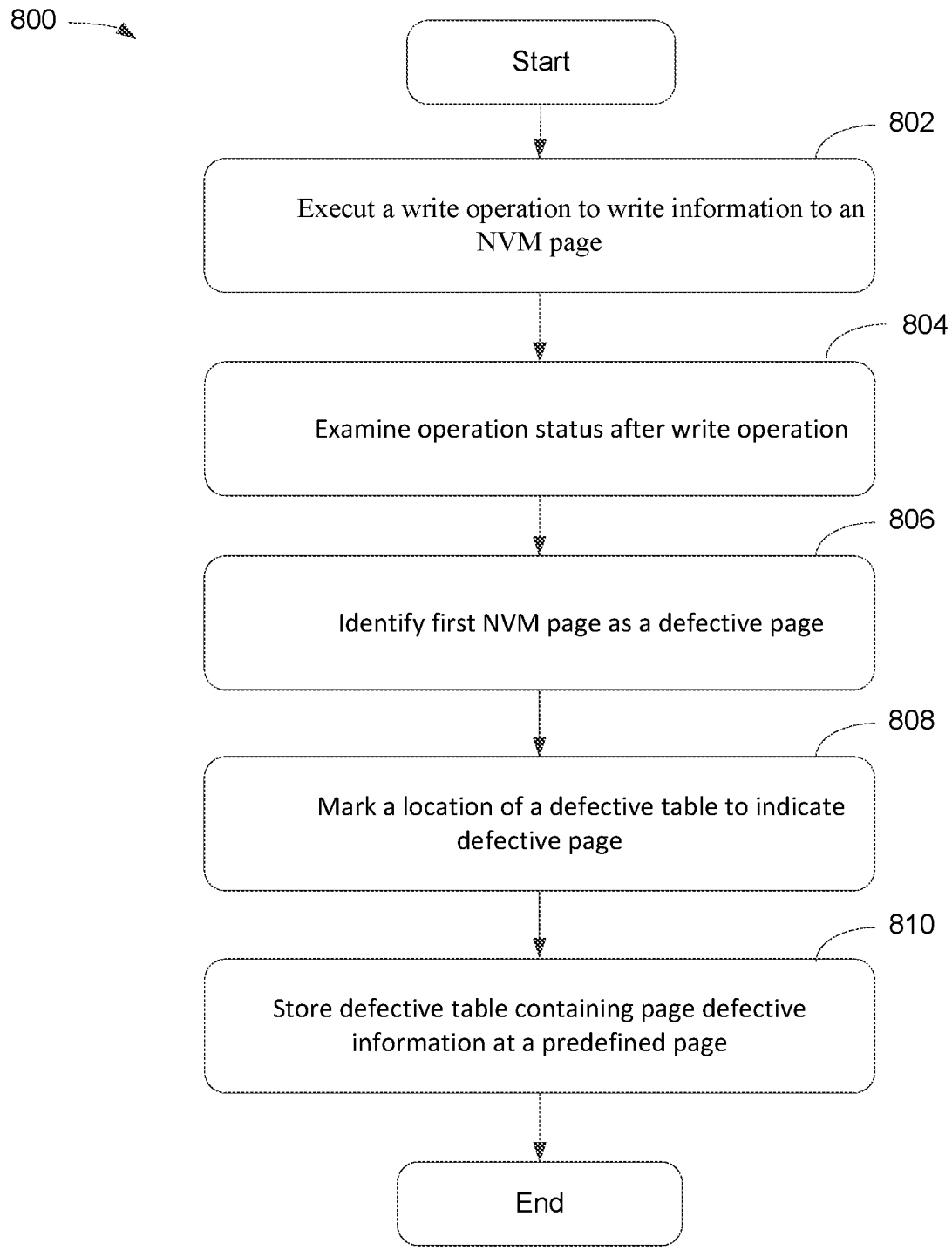
FIG. 8 is a flowchart illustrating a process of decommissioning a defective page in connection to a write operation in accordance with one embodiment of the present invention.

FIG. 8 is a flowchart 800 illustrating a process of decommissioning a defective page in connection to a write operation in accordance with one embodiment of the present invention. At block 802, a process capable of logically decommissioning an NVM page receives and executes a write operation for writing information to a first or targeted NVM page in an NVM block. In one example, a location of the first or targeted NVM block is identified based on LBA. The data is subsequently written to a flash based NVM page in the first NVM block.

At block 804, the operation status associated to the write operation to the first or targeted NVM page is examined once the write operation is completed. The operation status, for example, may include error rate and time consumed for performing the operation. The number of errors reported by error correction code ("ECC"), for instance, can be identified during the write operation.

At block 806, the process identifies the first or targeted NVM page as a defective page if the operation status fails to meet a set of predefined conditions for normal write operation. For example, the NVM page may be defective if WBD detects a longer programming time for completing the write operation than a predefined time frame. Alternatively, the NVM page is a defective after determining the number of errors recorded in the operation status is more than a predefined maximum number of error allowed for a normal write operation.

At block 808, a location of page status table is marked to indicate that the NVM page is defective. In one aspect, the process is capable of identifying a corresponding bit location to the NVM page in NVM block. A logic value such as logic 1 or 0 is subsequently set in the corresponding bit to indicate the defective page.

At block 810, the page status table containing page defective information associated with the NVM page is stored at a predefined page in the NVM block. Upon sending an instruction of data storage from a host to a memory controller for storing data persistently, the write operation with LBA is generated by the memory controller. In one example, the LBA can be translated to a physical page address ("PPA") which indexes the targeted NVM page in the NVM block using, for instance, FTL. The process, in one embodiment, identifies whether the NVM page is defective based on the defective information in the page status table before the write operation begins. The process is further capable of preserving content or data integrity of the page status table when the NVM block is set to be erased. The page status table, in one example, may be saved in a predefined page in the NVM block or a different NVM block.

Figure 9:
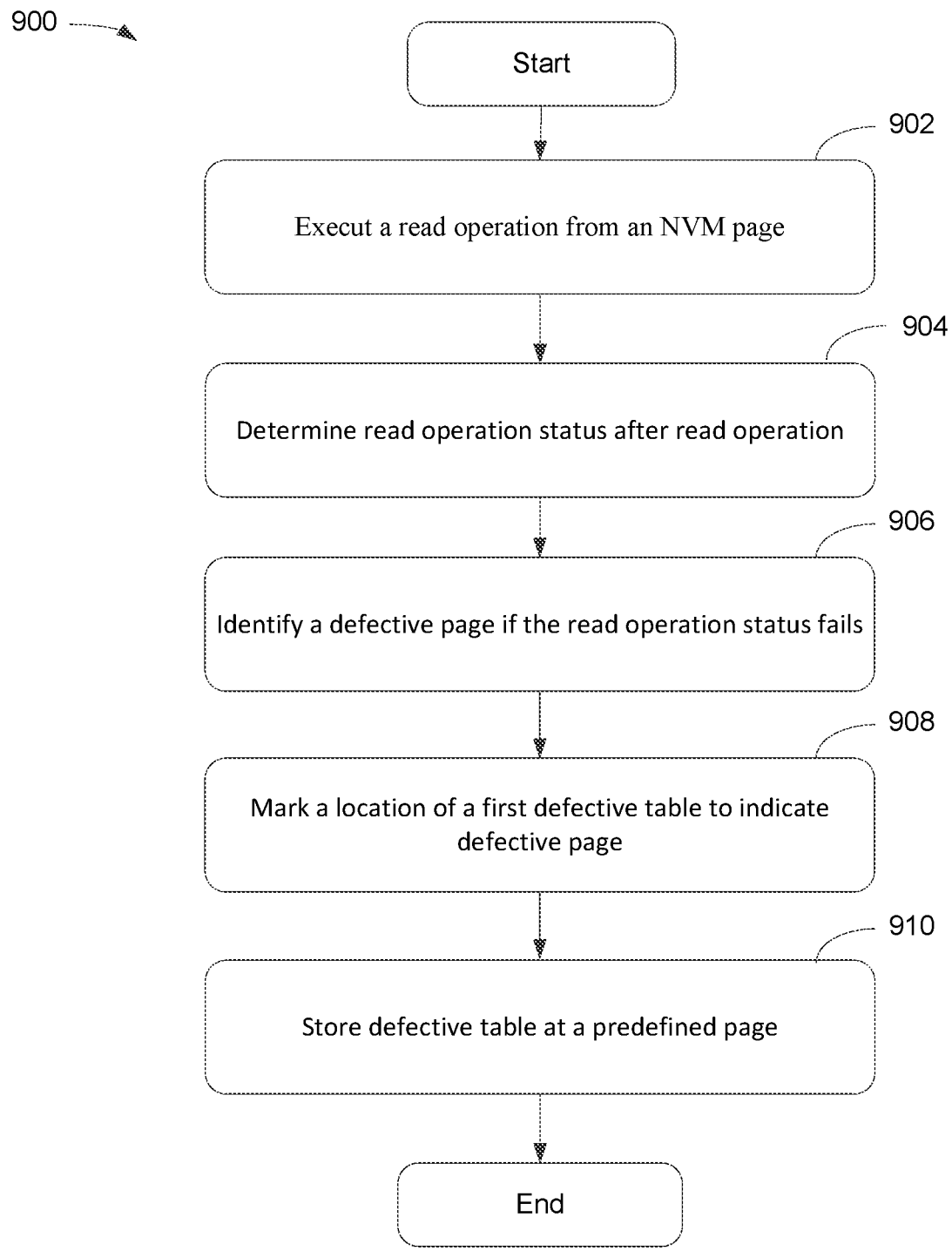
FIG. 9 is a flowchart illustrating a process of decommissioning a defective page during a read operation in accordance with one embodiment of the present invention.

FIG. 9 is a flowchart 900 illustrating a process of decommissioning a defective page during a read operation in accordance with one embodiment of the present invention. At block 902, a process capable of logically removing an NVM page receives and executes a read operation. To determine where to read from, a location of an NVM page within a block is identified based on the LBA. Once the block and pages are identified, data is read from a flash based NVM page in the NVM block.

At block 904, the read operation status of the NVM page is determined after the completion of the read operation. To determine the read operation status, number of errors reported by error correction code ("ECC") during the read operation is identified. Alternatively, the process is also able to identify total number of read times associated with the NVM page to determine the read operation status associated with the NVM page.

At block 906, the NVM page is identified as a defective page if the read operation status fails to meet the predefined minimal conditions for a normal read operation. Upon detecting a longer reading time for completing read operation, the NVM page is identified as a defective page. Alternatively, if the number of errors recorded during the read operation is higher than a predefined maximum number of error rate for a normal read operation, the NVM page is likely to be defective.

At block 908, a location of a page status table is marked to indicate that the NVM page is defective. For example, the process is capable of identifying a bit location in the bit map associated with the NVM page in the block.

At block 910, the page status table containing page defective information associated with the NVM page is stored at a predefined page in the NVM block. In one aspect, after sending an instruction of read data from a host to a memory controller for retrieving data from a storage device, the read operation with LBA is generated by the memory controller for carrying out the instruction. For example, the LBA is translated to a physical page address ("PPA") which indexes to the NVM page in the block using, for example, FTL. In one embodiment, the process is able to identify whether the NVM page is defective or not based on the page defective information associated with the NVM page stored in the page status table. In one aspect, the process preserves the content of the page status table when the NVM block is set to be erased. In one example, the page status table is saved in a predefined page of the block.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A method processed by a memory controller coupled to a non-volatile storage for logically decommissioning a non-volatile memory ("NVM") page, wherein the NV storage contains a plurality of blocks and each block is divided into multiple NVM pages wherein each NVM page contains at least four (4) kilobyte of storage capacity, the method comprising:
   executing a write operation to write information to a first NVM page in a first NVM block;
   examining operation status associated with the write operation to the first NVM page after completion of the write operation;
   identifying the first NVM page as a defective page if the operation status fails to meet predefined conditions for normal write operation;
   retrieving a first page status table from a designated NVM page in the first NVM block;

marking a location of the first page status table corresponding to the first NVM page to indicate the first NVM page as a defective NVM page;

storing the first page status table containing page defective information associated with the first NVM page at a predefined page location in the first NVM block; and preserving the first page status table at a storage location for subsequent restoration of page defective information when the first NVM block is to be recycled.

2. The method of claim 1, further comprising:

sending an instruction of data storage from a host to a memory controller for storing data persistently; and generating the write operation with a logic block address ("LBA") by the memory controller to write data to an NVM device.

3. The method of claim 2, further comprising translating the LBA to a physical page address ("PPA") indexing to the first NVM page in the first NVM block by a flash translation layer ("FTL").

4. The method of claim 3, further comprising identifying whether the first NVM page is defective in accordance with page defective information associated with the first NVM page in the first page status table.

5. The method of claim 1, further comprising preserving data integrity in the first page status table when the first NVM block is set to be erased.

6. The method of claim 1, wherein executing a write operation includes identifying location of the first NVM block in accordance with logic block address ("LBA") and writing data to a flash based NVM page in the first NVM block.

7. The method of claim 1, wherein examining the operation status of the first NVM page includes identifying number of errors reported by error correction code ("ECC") during the write operation.

8. The method of claim 1, wherein identifying the first NVM page as a defective page includes detecting longer programming time to complete the write operation than a predefined programming time.

9. The method of claim 1, wherein identifying the first NVM page as a defective page includes number of errors recorded in the operation status being more than a predefined maximum number of errors allowed for a normal write operation.

10. The method of claim 1, wherein marking a location of the first page status table to indicate the first NVM page as defective includes identifying first bit location associated with the first NVM page in a bit map representing all pages in the first NVM block; and setting logic value in the first bit location to indicate defective first NVM page.

11. The method of claim 1, wherein storing the first page status table includes saving the first page status table in a predefined page in the first NVM block.

12. A method processed by a memory controller coupled to a non-volatile storage for logically decommissioning a non-volatile memory ("NVM") page, wherein the NV storage contains a plurality of blocks and each block is divided into multiple NVM pages wherein each NVM page contains at least four (4) kilobyte of storage capacity, the method comprising:

executing a read operation to read information from a first NVM page in a first NVM block;

determining read operation status associated with the read operation after completion of the read operation;

identifying the first NVM page as a defective page if the read operation status fails to meet predefined minimal conditions for a read operation;

retrieving a first page status table from a designated NVM page in the first NVM block;

marking a location of the first page status table corresponding to the first NVM page to indicate the first NVM page as defective;

storing the first page status table containing page defective information associated with the first NVM page at a predefined page location in the first NVM block; and preserving the first page status table at a storage location for subsequent restoration of the page defective information when the first NVM block is to be recycled.

13. The method of claim 12, further comprising:

sending an instruction of read data from a host to a memory controller for retrieving data from a storage device; and generating the read operation with a logic block address ("LBA") by the memory controller for reading data from an NVM device.

14. The method of claim 13, further comprising translating the LBA to a physical page address ("PPA") indexing to the first NVM page in the first NVM block by a flash translation layer ("FTL").

15. The method of claim 14, further comprising identifying whether the first NVM page is defective in accordance with page defective information associated with the first NVM page in the first page status table.

16. The method of claim 12, further comprising preserving content of the first page status table when the first NVM block is set to be erased.

17. The method of claim 12, wherein executing a read operation includes identifying location of the first NVM block in accordance with logic block address ("LBA") and reading data from a flash based NVM page in the first NVM block.

18. The method of claim 12, wherein determining the read operation status of the first NVM page includes identifying number of errors reported by error correction code ("ECC") during the read operation.

19. The method of claim 18, wherein determining the read operation status of the first NVM page includes identifying number of read times associated with the first NVM page.

20. The method of claim 12, wherein identifying the first NVM page as a defective page includes detecting longer reading time to complete the read operation than a predefined reading time.

21. The method of claim 12, wherein identifying the first NVM page as a defective page includes determining number of errors recorded in the read operation status being more than a predefined maximum number of errors allowed for a normal read operation.

22. The method of claim 12, wherein marking a location of the first page status table to indicate the first NVM page as defective includes identifying first bit location associated with the first NVM page in a bit map which represents all pages in the first NVM block; and setting logic value of the first bit location to indicate defective first NVM page.

23. The method of claim 12, wherein storing the first page status table includes saving the first page status table in a predefined page in the first NVM block.

24. A solid-state device ("SSD") containing a plurality of non-volatile memory ("NVM"), comprising:

an NVM device configured to store information persistently, the NVM device configured to include a plurality of NVM blocks, wherein each of the plurality of NVM blocks includes a plurality of NVM pages and one of the plurality of NVM pages is allocated to store a page status table, the page status table configured to include a plurality of entries, wherein the plurality of entries of the page status table is associated to the plurality of NVM pages to indicate defective status of the plurality of NVM pages within each NVM block;

a page decommission manager coupled to the NVM device and configured to preserve the defective status in the page status table for subsequent restoration of page defective information during an NVM block recycling process; and a memory controller coupled to the NVM device and configured to logically decommission a defective NVM page in accordance with information stored in the page status table.

25. The SSD of claim 24, wherein the memory controller includes a flash translation layer which is configured to decommission an NVM page from a group of NVM pages in an NVM block.

26. The SSD of claim 24, wherein the page status table is a bit map, wherein bit position within the bit map corresponds to an NVM page location in an NVM block.

27. The SSD of claim 26, wherein logic values stored in the bit map indicate whether NVM pages are valid or defective.

28. The SSD of claim 24, wherein the page status table includes a set of entries, wherein each of the set of entries includes a validity bit and address bits, wherein the address bits are configured to index locations of defective pages in the NVM block.

* * * * *